United States Patent
Sakemi et al.

[11] Patent Number: 6,160,350
[45] Date of Patent: Dec. 12, 2000

[54] ION PLATING APPARATUS

[75] Inventors: Toshiyuki Sakemi; Masaru Tanaka, both of Niihama, Japan

[73] Assignee: Sumitomo Heavy Industries, Ltd., Tokyo, Japan

[21] Appl. No.: 09/269,737

[22] PCT Filed: Sep. 26, 1997

[86] PCT No.: PCT/JP97/03436

§ 371 Date: Jun. 28, 1999

§ 102(e) Date: Jun. 28, 1999

[87] PCT Pub. No.: WO99/16924

PCT Pub. Date: Apr. 8, 1999

[51] Int. Cl.[7] .................. H01J 7/24; H05B 31/26
[52] U.S. Cl. .................. 315/111.41; 315/111.81; 118/723 MP; 118/723 CB
[58] Field of Search ............ 315/111.41, 111.71, 315/111.81; 118/723 R, 723 CB, 723 MP, 723 MW

[56] References Cited

U.S. PATENT DOCUMENTS 4,980,610 12/1990 Varga ...................... 315/111.41

FOREIGN PATENT DOCUMENTS 63-47362 2/1988 Japan.
5-80555 11/1993 Japan.
6-340967 12/1994 Japan.

*Primary Examiner*—Michael B Shingleton
*Attorney, Agent, or Firm*—Arent Fox Kitner Plotkin & Kahn PLLC

[57] ABSTRACT

Around hearths 30a and 30b placed inside a vacuum chamber 11, auxiliary hearths 31a and 31b with annular permanent magnets included therein are arranged. Orientations of magnetic poles of annular permanent magnets 21a and 21b provided in two adjacent plasma guns 1A and 2B, orientations of magnetic poles of two adjacent electromagnetic coils 22a and 22b, orientations of two adjacent steering coils 24a and 24b, and orientations of magnetic poles of the two adjacent annular permanent magnets included in the two hearths are reversed from each other.

4 Claims, 6 Drawing Sheets

ION PLATING APPARATUS

TECHNICAL FIELD

The present invention relates to an ion plating apparatus equipped with a plurality of plasma guns.

PRIOR ART

It has been known that an ion plating apparatus using a pressure-gradient type plasma gun can form a high-quality film on a substrate. However, the thickness of the film formed on the substrate is nonuniform because of distortion of a plasma beam generated by the plasma gun. In view of the above, the present inventors have proposed an ion plating apparatus comprising an annular permanent magnet provided around a hearth serving as an anode so that the distortion of the plasma beam is suppressed.

Referring to FIGS. 1 and 2, description will be made about this ion plating apparatus. A pressure-gradient type plasma gun 101 comprises a cathode 102, a first intermediate electrode 103, and a second intermediate electrode 104. The first intermediate electrode 103 includes an annular permanent magnet while the second intermediate electrode 104 includes an electromagnetic coil. A steering coil 105 is provided around the plasma gun 101. A substrate 107 to be processed is placed in an upper part inside a vacuum chamber 106. A hearth 108 serving as an anode is provided in a lower part inside the vacuum chamber 106. An annular permanent magnet 109 is provided around the hearth 108.

Further referring to FIG. 3, description will be made about magnetic poles of the plasma gun 101, the steering coil 105, and the annular permanent magnet 109. Herein, with respect to the electromagnetic coil in the second intermediate electrode 104, an outgoing side of magnetic flux from the center of the coil is referred to as an N pole.

The first intermediate electrode 103 has an "S pole" at the side faced to the second intermediate electrode 104. Each of the second intermediate electrode 104 and the steering coil 105 has an "S pole" at the side faced to the first intermediate electrode 103. The permanent magnet 109 has an "S pole" at its upper side. This type is called an S type.

On the other hand, another type in which the first intermediate electrode 103, the second intermediate electrode 104, the steering coil 105, and the permanent magnet 109 have magnetic poles completely reverse to those in the above-mentioned S type is referred to as an N type.

When a plasma beam is generated from the plasma gun 101 in the above-mentioned ion plating apparatus, the plasma beam is less distorted as compared with a conventional ion plating apparatus which is not provided with the annular permanent magnet 109. However, in case of the S type, the plasma beam is biased leftwards in the figure from the center of the plasma gun 101, as shown in FIG. 2. On the other hand, in case of the N type, the plasma beam is biased rightwards. This results from a phenomenon, peculiar to the plasma, that distortion occurs in the plasma beam when an electric current flows through the plasma beam within a magnetic field.

Besides the above-mentioned ion plating apparatus, Japanese Unexamined Patent Publication (JP-A) No. 63-47362 discloses an ion plating apparatus comprising a plurality of plasma guns arranged in parallel in a single vacuum chamber. However, in case of this ion plating apparatus, magnetic fluxes of the plasma guns and steering coils interfere with one another. As a result, the distortion of the plasma beam becomes large in comparison with the ion plating apparatus provided with a single plasma gun.

Therefore, an object of the present invention is to provide an ion plating apparatus capable of suppressing distortion of a plurality of plasma beams when a plurality of plasma guns are provided in parallel.

DISCLOSURE OF THE INVENTION

An ion plating apparatus according to the present invention comprises a vacuum chamber provided with a plurality of plasma guns having magnet means, a steering coil provided in each of the plasma guns, and a plurality of hearths arranged in the vacuum chamber in correspondence to the plasma guns. An annular permanent magnet is arranged around each of the above-mentioned hearths. Orientations of magnetic poles of the two magnet means in every two adjacent plasma guns, orientations of magnetic poles of the two adjacent steering coils, and orientations of magnetic poles of the two adjacent annular permanent magnets are reversed from each other.

Modifications and embodiments of this ion plating apparatus are described in dependent claims 2 through 4.

BEST MODE FOR EMBODYING THE INVENTION

Figure 4:
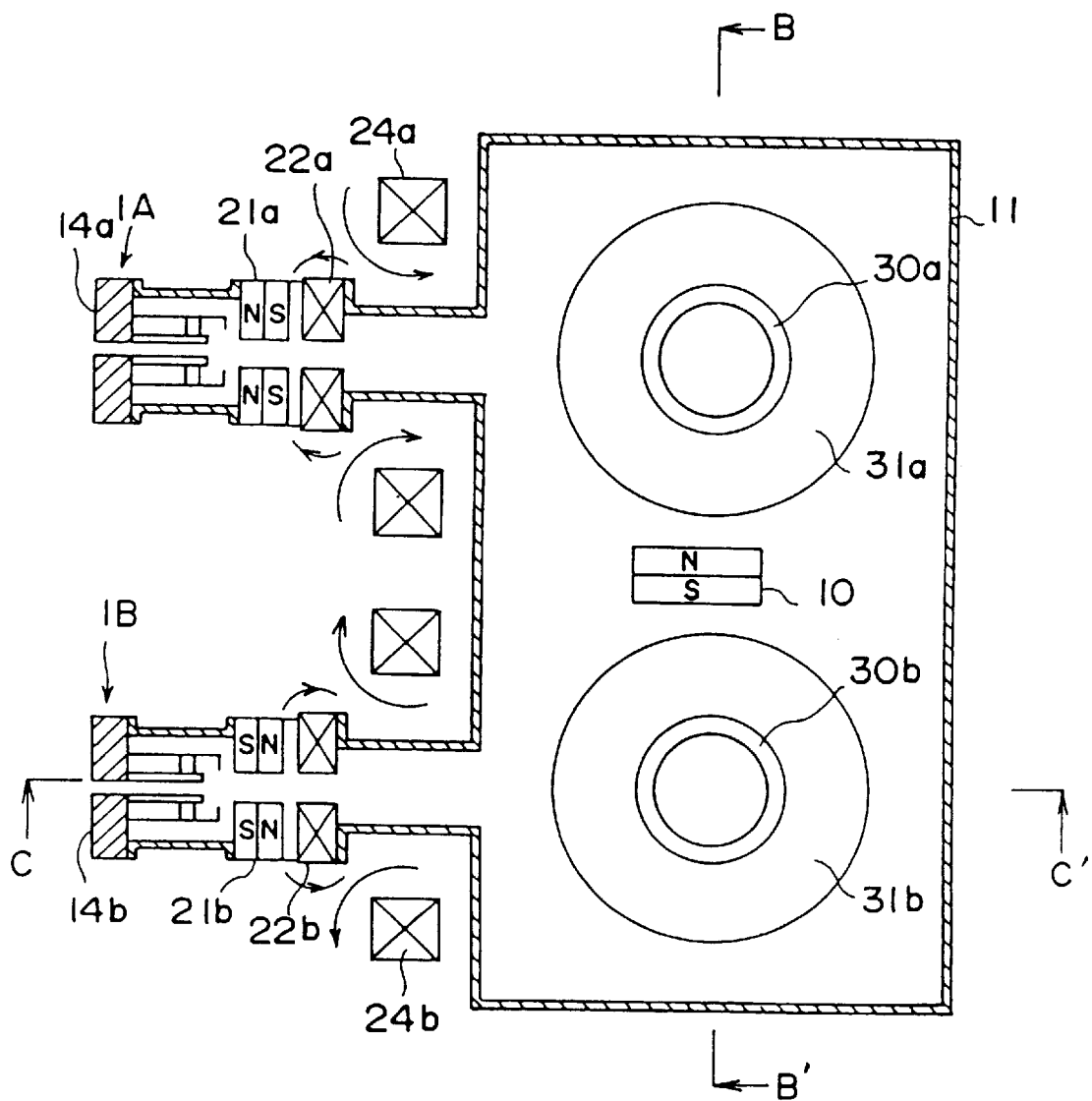
FIG. 4 is a horizontal sectional view of an ion plating apparatus according to the present invention.
Figure 5:
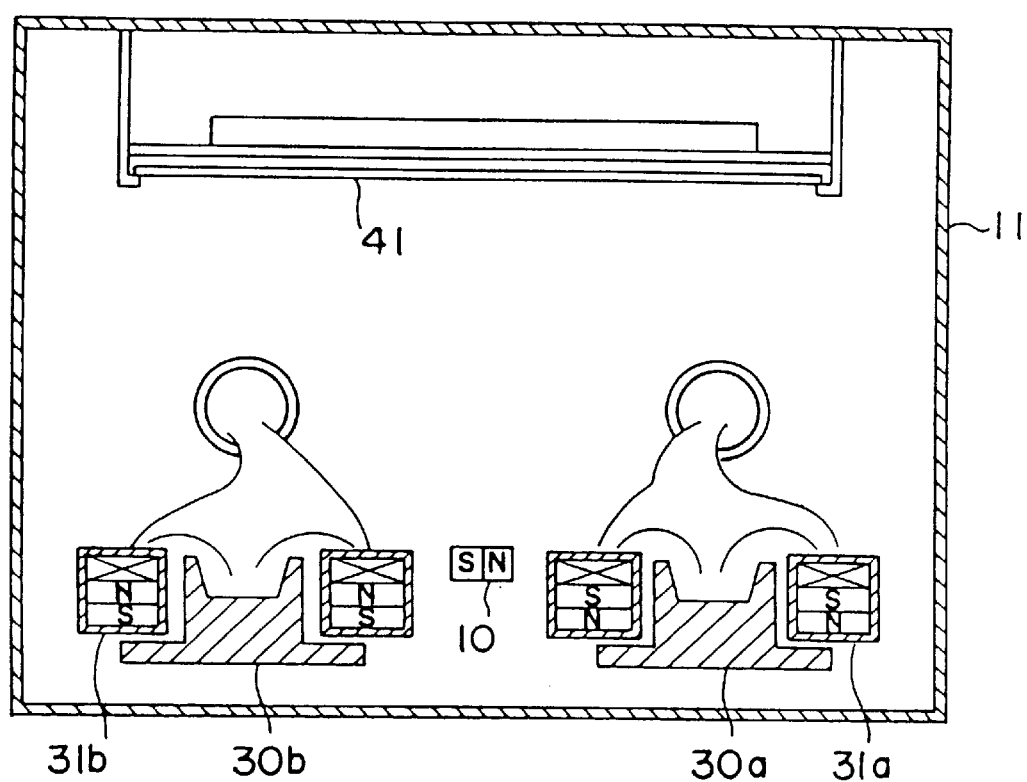
FIG. 5 is a sectional view taken along a line B–B' in FIG. 4.
Figure 6:
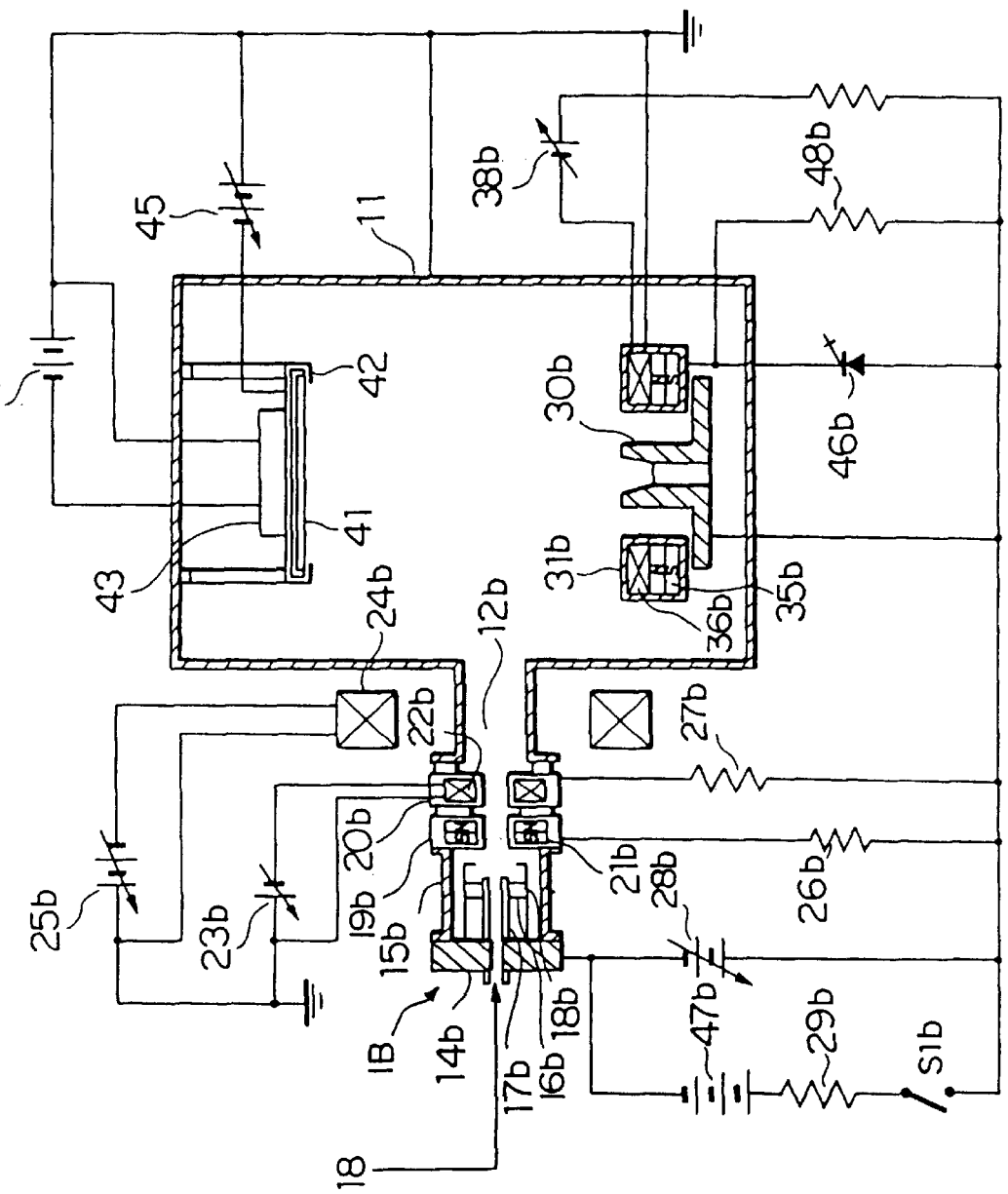
FIG. 6 is a sectional view taken along a line C–C' in FIG. 4.
Figure 7A:
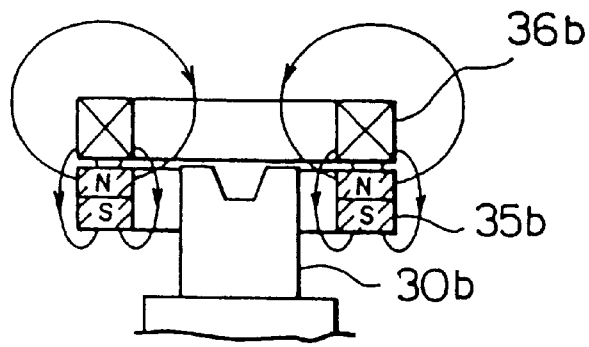
FIG. 7 shows examples of a combination of an annular permanent magnet and an electromagnetic coil illustrated in FIG. 5.
Figure 7B:
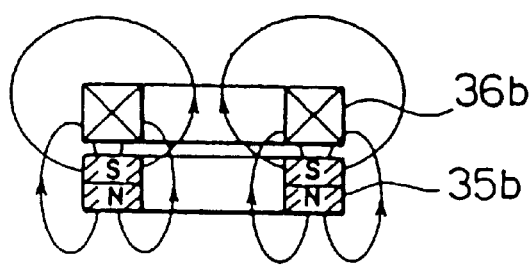
Figure 7C:
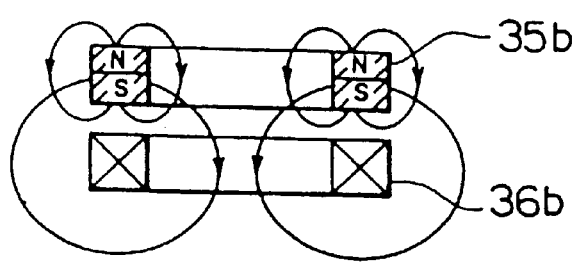
Figure 7D:
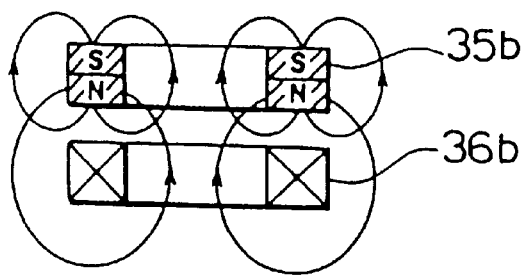

Referring to FIGS. 4 through 6, description will be made about an ion plating apparatus according to a preferred embodiment of the present invention. This ion plating apparatus is suitable for forming a film by depositing evaporation particles onto a substrate. In this embodiment, description will be directed to a case where two plasma guns 1A and 1B are provided in a vacuum chamber 11.

Referring to FIG. 6, the structure on the side of the plasma gun 1B will be described. The plasma gun 1B of a pressure-gradient type is attached to a cylindrical portion 12b formed on a side wall of the vacuum chamber 11. The plasma gun 1B has a glass tube 15b having one end closed by a cathode 14b. Inside the glass tube 15b, a cylinder 18b of molybdenum Mo is fixed to the cathode 14b with a circular disk 16b of an LaB$_6$ material and a pipe 17b of tantalum Ta contained in the cylinder. The pipe 17b serves to introduce into the plasma gun 1B a carrier gas 18 comprising an inert gas such as argon Ar, helium He, or the like.

Between the other end of the glass tube 15b opposite to the cathode 14b and the cylindrical portion 12b, first and second intermediate electrodes 19b and 20b are concentrically arranged. The first intermediate electrode (first grid) 19b includes an annular permanent magnet 21b for converging a plasma beam. Likewise, the second intermediate electrode (second grid) 20b includes an electromagnetic coil 22b for converging the plasma beam. The electromagnetic coil 22b is energized by a power source 23b.

Around the cylindrical portion 12b equipped with the plasma gun 1B, a steering coil 24b is provided to introduce the plasma beam into the vacuum chamber 11. The steering coil 24b is excited by a power source 25b. Between the cathode 14b and the first intermediate electrode 19b and between the cathode and the second intermediate electrode 20b, a main power source 28b of a variable-voltage type is connected through drooping resistors 26b and 27b, respectively.

A main hearth 30b and an annular auxiliary hearth 31b disposed therearound are installed in a lower part inside the vacuum chamber 11. The main hearth 30b has a concave portion for incidence of the plasma beam from the plasma gun 1B and contains an evaporation material such as an ITO (indium-tin oxide) tablet.

Both of the main hearth 30b and the auxiliary hearth 31b are made of an electrically conductive material having high thermal conductivity, for example, copper. The auxiliary hearth 31b is attached to the main hearth 30b through an insulator. The main hearth 30b and the auxiliary hearth 31b are connected through a resistor 48b.

The main hearth 30b is connected to a positive side of the main power source 28b. Thus, the main hearth 30b forms an anode for attracting the plasma beam generated by the plasma gun 1B.

An annular permanent magnet 35b and an electromagnetic coil 36b are arranged within the auxiliary hearth 31b. The electromagnetic coil 36b is energized by a hearth coil power source 38b. In this case, arrangement is made such that the direction of a center-side magnetic field of the electromagnetic coil 36b being excited is coincident with that of a center-side magnetic field generated by the annular permanent magnet 35b. The hearth coil power source 38b is a voltage-variable type power source so that an electric current to be supplied to the electromagnetic coil 36b can be varied by changing the voltage.

Inside the vacuum chamber 11, a substrate holder 42 is provided above the main hearth 30b to hold a substrate 41 onto which evaporation particles are deposited. The substrate holder 42 is provided with a heater 43. The heater 43 is energized by a heater power source 44. The substrate holder 42 is supported in an electrically insulated state with respect to the vacuum chamber 11. A bias power source 45 is connected between the vacuum chamber 11 and the substrate holder 42. With this structure, the substrate holder 42 is biased to a negative potential with respect to the vacuum chamber 11 connected to a zero potential.

The auxiliary hearth 31b is connected to the positive side of the main power source 28b through a changeover switch 46b. A drooping resistor 29b and an auxiliary discharge power source 47b are connected through a switch S1b to the main power source 28b in parallel thereto.

In the above-mentioned ion plating apparatus, discharge occurs between the cathode of the plasma gun 1B and the main hearth 30b inside the vacuum chamber 11 to thereby generate the plasma beam (not shown). This plasma beam is guided by a magnetic field determined by the steering coil 24b and the annular permanent magnet 35b in the auxiliary hearth 31b to reach the main hearth 30b. The evaporation material contained in the main hearth 30b is heated by the plasma beam to be evaporated. Evaporated particles are ionized by the plasma beam and deposited onto the surface of the substrate 41 applied with a negative voltage. Thus, a film is formed on the substrate 41.

Since the substrate 41 is an object to be processed which is common to the two plasma guns 1A and 1B, the substrate holder 42, the heater 43, the heater power source 44, and the bias power source 45 are also common to the two plasma guns 1A and 1B. The plasma gun 1A has a structure similar to that of the plasma gun 1B.

Figure 3:
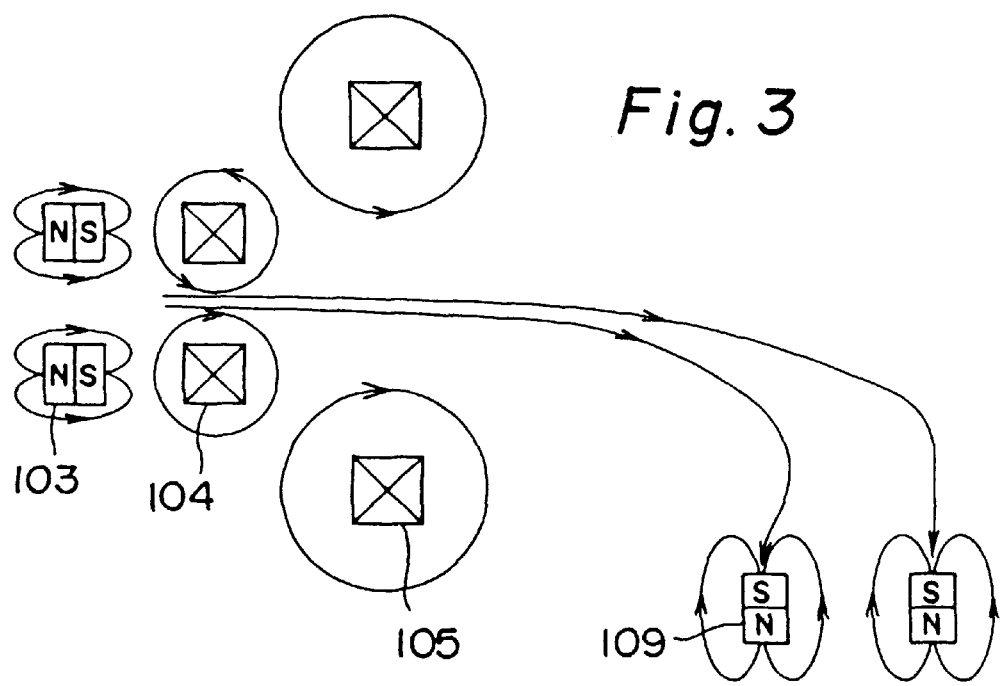
FIG. 3 is a view for describing the relationship among magnetic poles of a plasma gun, a steering coil, and an annular permanent magnet on the side of the hearth in the apparatus illustrated in FIG. 1.

Let the plasma gun shown in FIG. 3 (the magnetic poles of the first and the second intermediate electrodes 103 and 104 and the permanent magnet 109 are arranged as described in conjunction with FIG. 3) be represented as an S type. Then, an N type is a type in which the magnetic poles of the first and the second intermediate electrodes 103 and 104, and the permanent magnet 109 are reverse to those of the S type. The present invention is characterized in that the S-type plasma gun and the N-type plasma gun are arranged adjacent to each other.

Because of the difference between the S-type plasma gun and the N-type plasma gun, the magnetic poles are reversed between the steering coils 24a and 24b and between the auxiliary hearths 31a and 31b as shown in FIGS. 4 and 5. Each of the auxiliary hearths 31a and 31b may comprise the annular permanent magnet alone.

Figure 1:
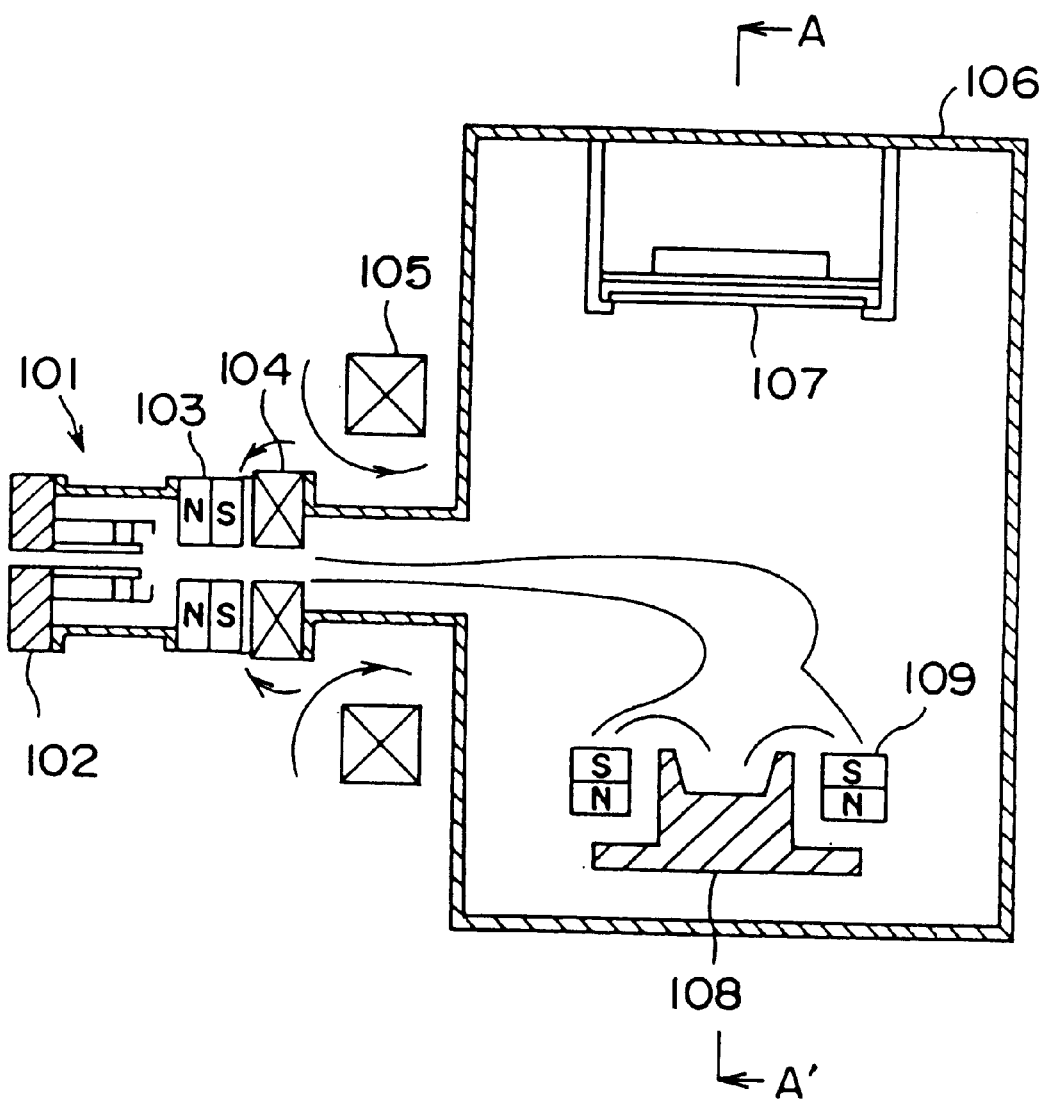
FIG. 1 is a vertical sectional view showing a conventional ion plating apparatus comprising an annular permanent magnet arranged around a hearth.
Figure 2:
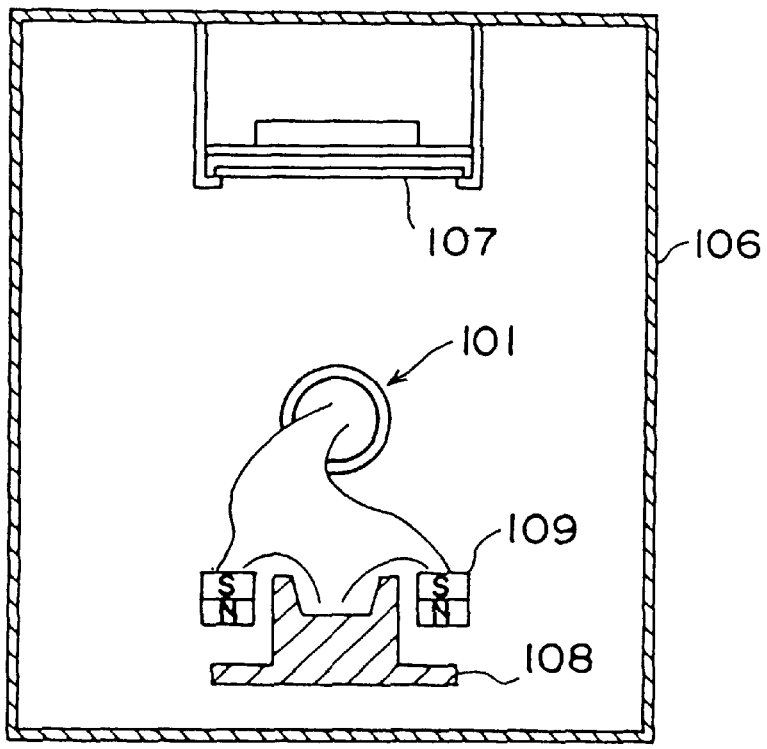
FIG. 2 is a sectional view taken along a line A–A' in FIG. 1.

For instance, in case where the plasma gun 1A alone is used, the plasma beam is once deflected leftwards in the figure because of the distortion of the plasma beam prior to incidence into the hearth and is thereafter incident into the hearth 108 from a position right above the hearth 108, as explained in conjunction with FIG. 2. Therefore, if two pairs of plasma guns and hearths with magnetic poles of the same orientation are arranged in parallel, each plasma is protruded leftwards in the figure and is then incident into the hearth.

On the other hand, as shown in FIG. 5, the S-type plasma gun 1A is placed on the right side in the figure while the N-type plasma gun 1B is placed on the left side in the figure so that the orientations of their magnetic poles are reversed. Thus, protrusions of the plasmas become symmetrical on right and left. Especially, in case where the plasma guns 1A and 1B are arranged as shown in FIG. 5, the two plasma beams once spread to approach and to meet each other at the center and are thereafter incident into the hearths 30a and 30b, respectively.

In this case, high-density plasma can be generated also in a region between the two plasma beams. It is therefore possible to perform ion plating utilizing the high-density plasma over a large area.

On the contrary, in order to reduce a damage by the plasma, the magnetic poles are arranged in a relationship reverse to that of FIG. 5. Specifically, the N-type plasma gun 1B is placed on the right side of FIG. 5 while the S-type plasma gun 1A is placed on the left side. As a result, it is possible to reduce the plasma around the center.

As described above, it is possible to change the plasma density In the region between the plasma beams by selecting the arrangement of the S-type and the N-type plasma guns. Alternatively, it is possible to control the plasma density by arranging a permanent magnet or an iron core inside or outside of the vacuum chamber.

For example, a permanent magnet 10 for plasma separation is arranged between the auxiliary hearths 31a and 31b as shown in FIGS. 4 and 5 so as to separate the plasmas between the auxiliary hearths 31a and 31b. In this case, the magnetic poles of the permanent magnet 10 are oriented so that the reverse magnetic poles are faced to the upper magnetic poles of the permanent magnets 10 in the auxiliary hearths 31a and 31b.

With respect to the side of the plasma gun 1B, the electromagnetic coil 36b is stacked on the annular permanent magnet 35b with the N pole directed upwards in the above-mentioned embodiment, as shown in (a) of FIG. 7.

Alternatively, as shown in (b) of FIG. 7, the electromagnetic coil 36b may be stacked on the annular permanent magnet 35b with the S pole directed upward. In this case, the electric current to be supplied to the electromagnetic coil 36b is reversed from that in the case of (a) in FIG. 7.

On the other hand, as shown in (c) of FIG. 7, the electromagnetic coil 36b may be stacked under the annular permanent magnet 35b with the N pole directed upwards. Further, as shown in (d) of FIG. 7, the electromagnetic coil 36b may be stacked under the annular permanent magnet 35b with the S pole directed upwards. In these cases, the electric current is supplied so that the direction of the center-side magnetic field of the electromagnetic coil 36b being excited is identical with that of the center-side magnetic field generated by the annular permanent magnet 35b, as described in the foregoing.

INDUSTRIAL APPLICABILITY

According to the present invention, the orientations of the magnetic poles are reversed between the steering coils of every two adjacent ones of the plasma guns and between the auxiliary hearths. With this structure, interference between the magnetic fluxes generated therefrom is reduced and the distortion of the plasma beam is suppressed. As a result, it is possible to provide the ion plating apparatus capable of performing ion plating using a high-density plasma over a wide area.

What is claimed is:

1. An ion plating apparatus comprising a vacuum chamber provided with a plurality of plasma guns having magnet means, a steering coil provided in each of said plurality of plasma guns, and a plurality of hearths arranged in said vacuum chamber in correspondence to said plurality of plasma guns, wherein:

an annular permanent magnet is arranged around each of said plurality of hearths;

orientations of magnetic poles of said two magnet means in every two adjacent plasma guns, orientations of magnetic poles of the two adjacent steering coils, and orientations of magnetic poles of the two adjacent annular permanent magnets being reversed from each other.

2. An ion plating apparatus as claimed in claim 1, wherein a permanent magnet or an iron core is arranged inside or outside of said vacuum chamber to control the distribution of a plasma generated by each of said plurality of plasma guns.

3. An ion plating apparatus as claimed in claim 1, wherein a permanent magnet for plasma separation is arranged between every two adjacent ones of said hearths, magnetic poles of said annular permanent magnets on the side faced to said plasma guns being reversed from magnetic poles of said annular permanent magnet for plasma separation on the side faced to said annular permanent magnets.

4. An ion plating apparatus as claimed in any one of claims 1 through 3, wherein an electromagnetic coil is stacked on each of said annular permanent magnets.

\* \* \* \* \*